(12) United States Patent
Kroeger

(10) Patent No.: US 7,127,008 B2
(45) Date of Patent: Oct. 24, 2006

(54) COHERENT AM DEMODULATOR USING A WEIGHTED LSB/USB SUM FOR INTERFERENCE MITIGATION

(75) Inventor: Brian William Kroeger, Sykesville, MD (US)

(73) Assignee: iBiquity Digital Corporation, Columbia, MD (US)

( * ) Notice: Subject to any disclaimer, the term of this patent is extended or adjusted under 35 U.S.C. 154(b) by 131 days.

(21) Appl. No.: 10/373,484

(22) Filed: Feb. 24, 2003

(65) Prior Publication Data

US 2004/0165680 A1   Aug. 26, 2004

(51) Int. Cl.
*H03D 1/24* (2006.01)

(52) U.S. Cl. .............. 375/321; 375/235; 375/316; 375/270; 455/296; 455/126; 370/529

(58) Field of Classification Search ........ 375/321, 375/270, 285, 230, 348, 347, 322, 357, 222, 375/235, 316; 455/126, 296; 381/15; 370/529
See application file for complete search history.

(56) References Cited

U.S. PATENT DOCUMENTS

| | | | |
|---|---|---|---|
| 3,638,122 A * | 1/1972 | Gibson | 375/230 |
| 4,648,114 A | 3/1987 | Ichikawa | |
| 5,008,939 A * | 4/1991 | Bose et al. | 381/15 |
| 5,339,455 A | 8/1994 | Vogt et al. | |
| 5,493,717 A | 2/1996 | Schwarz | |
| 5,588,022 A | 12/1996 | Dapper et al. | |
| 5,631,963 A | 5/1997 | Herrmann | |
| 5,982,825 A | 11/1999 | Tsujimoto | |
| 6,005,894 A * | 12/1999 | Kumar | 375/270 |
| 6,014,412 A | 1/2000 | Wiese et al. | |
| 6,058,148 A | 5/2000 | Whikehart et al. | |
| 6,137,843 A | 10/2000 | Chennakeshu et al. | |
| 6,192,238 B1 | 2/2001 | Piirainen | |
| 6,304,624 B1 | 10/2001 | Seki et al. | |
| 6,307,599 B1 | 10/2001 | Komatsu | |
| 6,445,693 B1 | 9/2002 | Sarraf et al. | |
| 6,456,673 B1 | 9/2002 | Wiese et al. | |
| 6,510,175 B1 | 1/2003 | Hunsinger et al. | |
| 6,711,214 B1 * | 3/2004 | Hershberger | 375/285 |
| 2001/0044288 A1 | 11/2001 | Zumkeller et al. | |
| 2003/0035498 A1 * | 2/2003 | Li et al. | 375/322 |
| 2003/0092406 A1 * | 5/2003 | Ito et al. | |

OTHER PUBLICATIONS

D. C. Hartup et al., "AM Hybrid IBOC DAB System," *USA Digital Radio*, 1997, pp. 1-8.

(Continued)

*Primary Examiner*—Chieh M. Fan
*Assistant Examiner*—Eva Zheng
(74) *Attorney, Agent, or Firm*—Robert P. Lenart, Esq.; Pietragallo, Bosick & Gordon LLP

(57) ABSTRACT

A method of processing an AM radio signal comprises the step of receiving an AM radio signal including an upper sideband portion and a lower sideband portion, demodulating the upper sideband portion and the lower sideband portion to produce a demodulated upper sideband signal and a demodulated lower sideband signal, weighting the demodulated upper sideband signal and the demodulated lower sideband signal in response to noise power to produce a weighted demodulated upper sideband signal and a weighted demodulated lower sideband signal, and combining the weighted demodulated upper sideband signal and the weighted demodulated lower sideband signal to produce an output signal. Demodulators which process AM radio signals in accordance with the method, and receivers incorporating the demodulators, are also included.

38 Claims, 5 Drawing Sheets

OTHER PUBLICATIONS

"System for Digital Sound Broadcasting in the Broadcasting Bands Below 30 MHz," Draft New Recommendation ITU-BS, International Telecommunication Union, Radiocommunication Study Groups, Oct. 25, 2000, pp. 1-30.

IBOC AM Transmission Specification, Nov. 2001, pp. 1-28.

D. M. Funderburk et al., "A Digital Receiver Design for AM Stereo Signals Using Compatible Quadrature Amplitude Modulation."

* cited by examiner

US 7,127,008 B2

COHERENT AM DEMODULATOR USING A WEIGHTED LSB/USB SUM FOR INTERFERENCE MITIGATION

FIELD OF THE INVENTION

This invention relates to AM radio signal processing and more particularly to methods and apparatus for demodulating AM radio signals.

BACKGROUND INFORMATION

Reception of AM signals in the broadcast band is often degraded due to adjacent channel interference (ACI). Much of this interference is a result of the 10 kHz spacing of 20 kHz (±10 kHz) bandwidth analog signals, where nearly half the bandwidth of a first adjacent analog signal overlaps the signal of interest (SOI).

In-Band On-Channel (IBOC) Digital Audio Broadcasting (DAB) systems are being implemented to provide a smooth evolution from current analog Amplitude Modulation (AM) radio to a fully digital In-Band On-Channel system. IBOC DAB requires no new spectral allocations because each IBOC DAB signal is transmitted within the spectral mask of an existing AM channel allocation. IBOC DAB promotes economy of spectrum while enabling broadcasters to supply digital quality audio to the present base of listeners.

One AM IBOC DAB system, set forth in U.S. Pat. No. 5,588,022, presents a method for simultaneously broadcasting analog and digital signals in a standard AM broadcasting channel. Using this approach, an amplitude-modulated radio frequency signal having a first frequency spectrum is broadcast. The amplitude-modulated radio frequency signal includes a first carrier modulated by an analog program signal. Simultaneously, a plurality of digitally modulated carrier signals are broadcast within a bandwidth that encompasses the first frequency spectrum. Each digitally modulated carrier signal is modulated by a portion of a digital program signal. A first group of the digitally modulated carrier signals lies within the first frequency spectrum and is modulated in quadrature with the first carrier signal. Second and third groups of the digitally-modulated carrier signals lie in upper and lower sidebands outside of the first frequency spectrum and are modulated both in-phase and in-quadrature with the first carrier signal. Multiple carriers employ orthogonal frequency division multiplexing (OFDM) to bear the communicated information.

In-Band On-Channel (IBOC) AM digital audio broadcasting can exacerbate the interference problem for conventional AM radio signals by the introduction of the digital sidebands of IBOC signals in the band of the signal of interest.

There is a need for a method and apparatus for demodulating AM radio signals that can improve AM radio receiver performance when receiving signals subject to interference.

SUMMARY OF THE INVENTION

This invention provides a method of processing an AM radio signal comprising the steps of receiving an AM radio signal including an upper sideband portion and a lower sideband portion, demodulating the upper sideband portion and the lower sideband portion to produce a demodulated upper sideband signal and a demodulated lower sideband signal, weighting the demodulated upper sideband signal and the demodulated lower sideband signal in response to noise power to produce a weighted demodulated upper sideband signal and a weighted demodulated lower sideband signal, and combining the weighted demodulated upper sideband signal and the weighted demodulated lower sideband signal to produce an output signal.

The AM radio signal can be single sideband filtered prior to the step of demodulating the upper sideband portion and the lower sideband portion.

The method can further comprise the step of determining the noise power of the demodulated upper and lower sideband signals prior to the step of weighting the demodulated upper sideband signal and the demodulated lower sideband signal. The step of determining the noise power of the demodulated upper and lower sideband signals can comprise the steps of cross-correlating a quadrature component of the demodulated upper sideband signal with the demodulated upper sideband signal, and cross-correlating a quadrature component of the demodulated lower sideband signal with the demodulated lower sideband signal.

The step of cross-correlating the quadrature component of the demodulated upper sideband signal with the demodulated upper sideband signal can comprise the steps of shifting the quadrature component of the demodulated upper sideband signal by 90° and multiplying the shifted quadrature component of the demodulated upper sideband signal by the demodulated upper sideband signal, and the step of cross-correlating a quadrature component of the demodulated lower sideband signal with the demodulated lower sideband signal can comprise the steps of shifting the quadrature component of the demodulated lower sideband signal by 90° and multiplying the shifted quadrature component of the demodulated lower sideband signal by the demodulated lower sideband signal.

The step of weighting the demodulated upper and lower sideband signals can comprise the steps of multiplying the demodulated upper sideband signal by a weighting factor, and multiplying the demodulated lower sideband signal by one minus the weighting factor.

In another aspect, the invention includes a method of processing an AM radio signal including an upper sideband portion and a lower sideband portion, wherein the method comprises the steps of multiplying a Hilbert Transform of an imaginary component of the radio signal by a weighted correction signal to obtain a weighted signal, and subtracting the weighted signal from a coherent double sideband signal.

The invention also encompasses demodulators for processing an AM radio signal comprising means for demodulating the upper sideband portion and the lower sideband portion of an AM radio signal to produce a demodulated upper sideband signal and a demodulated lower sideband signal, means for weighting the demodulated upper sideband signal and the demodulated lower sideband signal in response to noise power to produce a weighted demodulated upper sideband signal and a weighted demodulated lower sideband signal, and means for combining the weighted demodulated upper sideband signal and the weighted demodulated lower sideband signal.

The demodulators can further comprise means for determining the noise power of the demodulated upper and lower sideband signals prior to weighting the demodulated upper and lower sideband signals.

The means for determining the noise power of the demodulated upper and lower sideband signals can comprise means for cross-correlating a quadrature component of the demodulated upper sideband signal with the demodulated upper sideband signal, and means for cross-correlating a quadrature component of the demodulated lower sideband signal with the demodulated lower sideband signal.

The means for cross-correlating the quadrature component of the demodulated upper sideband signal with the demodulated upper sideband signal can comprise means for shifting the quadrature component of the demodulated upper sideband signal by 90° and for multiplying the shifted quadrature component of the demodulated upper sideband signal by the demodulated upper sideband signal, and the means for cross-correlating the quadrature component of the demodulated lower sideband signal with the demodulated lower sideband signal can comprise means for shifting the quadrature component of the demodulated lower sideband signal by 90° and for multiplying the shifted quadrature component of the demodulated lower sideband signal by the demodulated lower sideband signal.

The means for weighting the demodulated upper and lower sideband signals can comprise means for multiplying the demodulated upper sideband signal by a weighting factor, and means for multiplying the demodulated lower sideband signal by one minus the weighting factor.

In another aspect, the invention encompasses receivers for processing an AM radio signal comprising means for receiving an AM radio signal including an upper sideband portion and a lower sideband portion, means for demodulating the upper sideband portion and the lower sideband portion to produce a demodulated upper sideband signal and a demodulated lower sideband signal, means for weighting the demodulated upper sideband signal and the demodulated lower sideband signal in response to noise power to produce a weighted demodulated upper sideband signal and a weighted demodulated lower sideband signal, and means for combining the weighted demodulated upper sideband signal and the weighted demodulated lower sideband signal to produce an output signal.

The receivers can further comprise means for single sideband filtering the AM radio signal prior to demodulating the upper sideband portion and the lower sideband portion.

The receivers of this invention can automatically select between lower sideband (LSB), upper sideband (USB) or double sideband (DSB) coherent demodulation as a function of the interference. A maximum ratio combining (MRC) technique can approach DSB detection performance when the interference in the sidebands is equal.

DETAILED DESCRIPTION OF THE INVENTION

This invention provides a method for a receiver to automatically select between lower sideband (LSB), upper sideband (USB) or double sideband (DSB) coherent demodulation as a function of the interference. Furthermore a means for weighting the sum of the LSB and USB to obtain the maximum audio signal-to-noise ratio (SNR) is described. This method is based on a maximum ratio combining (MRC) technique which approaches DSB detection performance when the interference in the sidebands is equal. The receiver can automatically achieve the maximum audio SNR under all possible interference conditions. It can also be shown that the adverse impact of IBOC on AM receivers is minimal when using this demodulation technique. An AM-only demodulator employing this technique is described, as well as demodulation of the AM analog portion of a Hybrid IBOC DAB signal.

Figure 1:
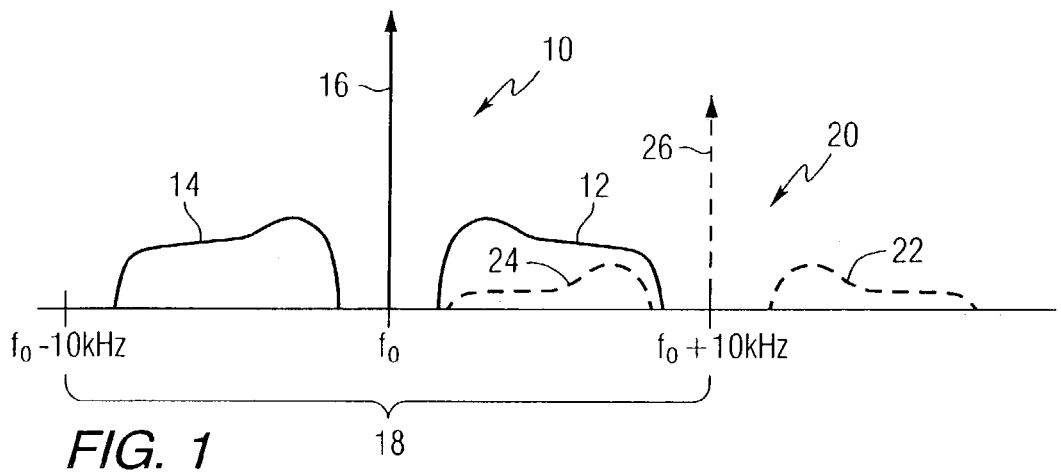
FIG. 1 is a schematic representation of an analog AM radio signal and an adjacent channel analog AM interfering signal.

FIG. 1 is a schematic representation of an AM radio signal of interest 10 that includes an upper sideband 12 and a lower sideband 14 on opposite sides of a carrier signal 16 in a channel 18. An adjacent channel AM interfering signal 20 is shown to include an upper side band 22, a lower sideband 24, and a carrier 26. The center frequencies of the signal of interest and the adjacent channel are spaced 10 kHz apart, such that the lower sideband signal of the interfering signal overlaps at least a portion of the upper sideband of the signal of interest.

Figure 2:
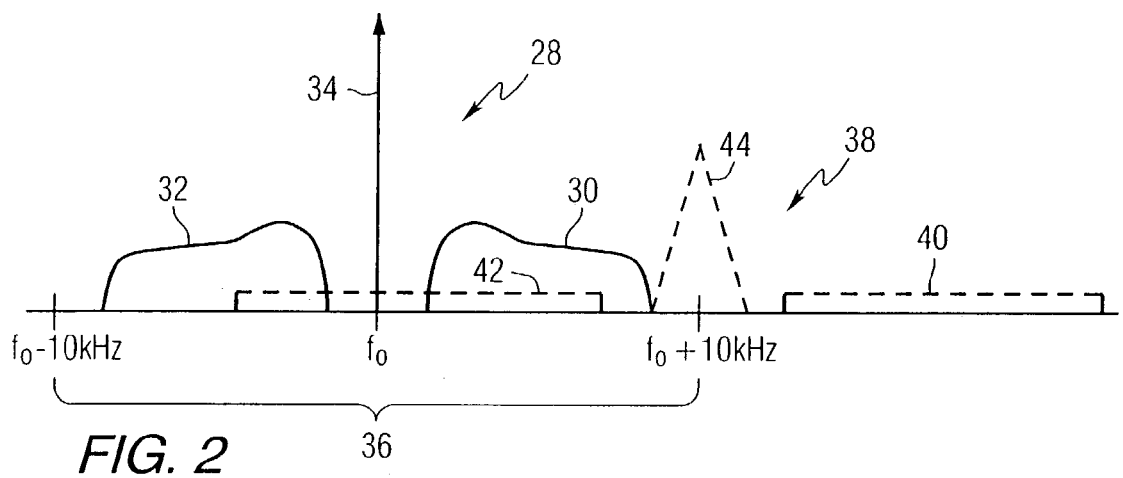
FIG. 2 is a schematic representation of an analog AM radio signal and an adjacent channel IBOC interfering signal.

FIG. 2 is a schematic representation of an AM radio signal of interest 28 that includes an upper sideband 30 and a lower sideband 32 on opposite sides of a carrier signal 34 in a channel 36. An adjacent channel AM In-Band On-Channel DAB interfering signal 38 is shown to include an upper side band 40, a lower sideband 42, and an analog modulated carrier 44. The center frequencies of the signal of interest and the adjacent AM In-Band On-Channel DAB signal are spaced 10 kHz apart, such that the lower sideband signal of the interfering signal overlaps at least a portion of the upper sideband of the signal of interest.

While the examples of FIGS. 1 and 2 show adjacent channel interference, it should be recognized that this invention is useful in other interference scenarios as well.

Figure 3:
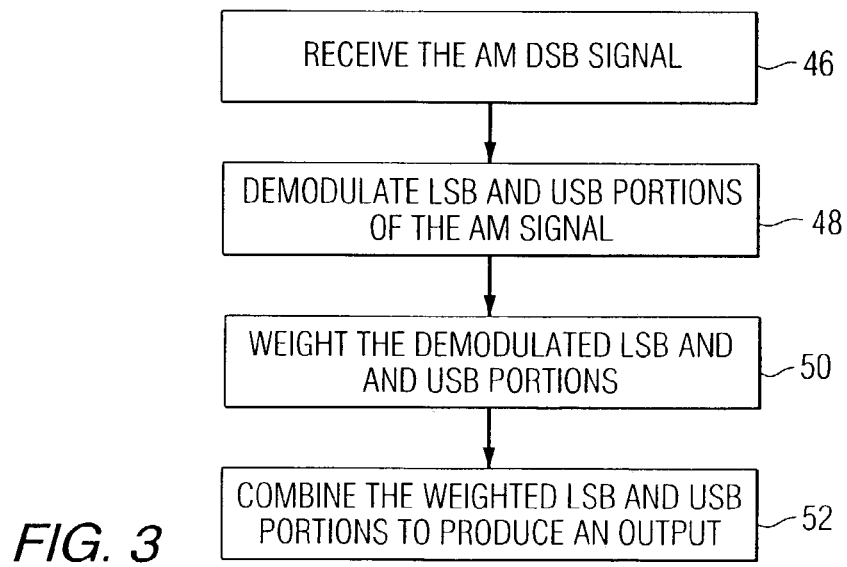
FIG. 3 is a flow diagram illustrating the method of the invention.

FIG. 3 is a flow diagram illustrating the method of the invention. As shown in FIG. 3, this invention encompasses a method of processing an AM radio signal. The invention applies to demodulation of both an AM-only signal and the analog AM portion of a hybrid IBOC DAB signal. Block 46 shows the reception of an AM radio signal including an upper sideband portion and a lower sideband portion. The upper sideband portion and the lower sideband portion of the AM radio signal are then demodulated to produce a demodulated upper sideband signal and a demodulated lower sideband signal as shown in block 48. The demodulated lower sideband signal and the demodulated upper sideband signal are then weighted in response to noise power to produce a weighted demodulated upper sideband signal and a weighted demodulated lower sideband signal as shown in block 50. Then the weighted demodulated upper sideband signal and the weighted demodulated lower sideband signal are combined to produce an output signal as shown in block 52.

The method of the invention can now be described in greater detail. First consider the AM-only scenario in which an AM signal of interest is subject to interference by a second AM signal, for example from an adjacent channel.

The typical AM signal s(t) is defined as:

$$s(t)=[1+m(t)]\cdot\sqrt{2}\cdot\cos(2\pi f_c\cdot t)$$

where $f_c$ is the carrier frequency, and m(t) is a real analog (audio) baseband signal limited to ±1.

The variance of m(t) is typically held to about 12 dB lower than the carrier component (with the carrier normalized to unity for convenience) due to audio processing at the transmitter. This modulation produces a symmetric double sideband (DSB) signal in the frequency domain with twice the bandwidth of the original audio signal. The signal includes a lower frequency sideband (LSB), and an upper sideband (USB). Present broadcast audio signals are band-limited to less than 10 kHz, resulting in a DSB signal less than 20 kHz bandwidth.

The time domain versions of these LSB and USB signals are labeled lsb and usb, respectively. The sideband signals can be obtained from the (corrupted) original signal through a Hilbert Transform, or equivalent, resulting in:

$$LSB(f) = \begin{cases} DSB(f); & f < f_c \\ 0; & \text{otherwise} \end{cases} \text{ and } USB(f) = \begin{cases} DSB(f); & f > f_c \\ 0; & \text{otherwise} \end{cases}$$

A coherent receiver must provide a means for tracking the frequency and phase of the main carrier. This is usually done with a phase-locked loop (PLL), which is also designed to recreate its own version of the main carrier within the receiver. A coherent receiver demodulates the received signal by multiplying the recreated carrier and the received signal r(t), then removing the dc component (mean) to produce the demodulated baseband signal $\hat{m}(t)$.

$$\hat{m}(t)=\{\sqrt{2}\cdot\cos(2\pi f_c\cdot t+\phi(t))\cdot r(t)-1\}_{lpf}, \text{ where } r(t)=s(t)+n'(t)$$

$\phi(t)$ is the instantaneous phase tracking error, n'(t) is noise and/or interference, while the lpf subscript implies lowpass filtering of the result to remove the unwanted higher frequency artifacts. Then:

$$\hat{m}(t)=\{[\cos(\phi(t),+\cos(4\pi f_c\cdot t+\phi(t))]\cdot[m(t)+1]-1+\sqrt{2}\cdot n'(t)\cdot\cos(2\pi f_c\cdot t+\phi(t))\}_{lpf}$$

when the phase error $\phi(t)$ is small the result can be approximated by:

$$\hat{m}(t)\cong m(t)+\sqrt{2}\cdot\cos(2\pi f_c\cdot t+\phi(t))\cdot n'(t)$$

then $\hat{m}(t)\cong m(t)+n(t)$, where $n(t)$ includes all the noise-like terms.

It is also assumed that the noise terms due to the phase-tracking error $\phi(t)$ are smaller than the channel noise such that n(t) has variance not significantly greater than n(t), which is usually the case. Therefore any degradation is dominated by the additive noise and interference within the passband around the signal of interest.

Coherent SSB demodulation can be similarly accomplished after single sideband (SSB) filtering of the LSB or USB of the received signal. The complex upper or lower sidebands can be obtained through Hilbert transformation of the received signal.

$$usb(t) = r(t) + i\cdot r_h(t)$$
$$= m(t) + \text{Re}\{n(t)\} + i\cdot\text{Im}\{n(t)\} +$$
$$i\cdot[m(t)_h + \text{Re}\{n(t)\}_h + i\cdot\text{Im}\{n(t)\}_h]$$
$$= m(t) + \text{Re}\{n(t)\} - \text{Im}\{n(t)\}_h +$$
$$i\cdot[m(t)_h + \text{Re}\{n(t)\}_h + \text{Im}\{n(t)\}]$$
$$lsb(t) = r(t) - i\cdot r_h(t)$$
$$= m(t) + \text{Re}\{n(t)\} + i\cdot\text{Im}\{n(t)\} -$$
$$i\cdot[m(t)_h + \text{Re}\{n(t)\}_h + i\cdot\text{Im}\{n(t)\}_h]$$
$$= m(t) + \text{Re}\{n(t)\} + \text{Im}(n(t)\}_h -$$
$$i\cdot[m(t)_h + \text{Re}\{n(t)\}_h - \text{Im}\{n(t)\}]$$

where the subscript h denotes the Hilbert Transform of the signal. The recovered USB or LSB signal estimates of m(t) are the real part of the complex sideband signals.

$$\hat{m}_{usb}(t)=\text{Re}\{r(t)+i\cdot r_h(t)\}=m(t)+\text{Re}\{n(t)\}-\text{Im}\{n(t)\}_h$$

$$\hat{m}_{lsb}(t)=\text{Re}\{r(t)-i\cdot r_h(t)\}=m(t)+\text{Re}\{n(t)\}+\text{Im}\{n(t)\}_h$$

Then a receiver needs to compute only the real part of the sideband signals as:

$$\hat{m}_{usb}(t)=\text{Re}\{r(t)\}-\text{Im}\{r(t)\}_h$$

$$\hat{m}_{lsb}(t)=\text{Re}\{r(t)\}+\text{Im}\{r(t)\}_h$$

The sidebands can be combined resulting in the equivalent DSB demodulation.

$$\hat{m}(t) = \frac{\hat{m}_{usb}(t) + \hat{m}_{lsb}(t)}{2} = m(t) + \text{Re}\{n(t)\}$$

It is of particular interest here when n(t) is not symmetric about the carrier frequency, and affects one sideband more than the other. This is often the case with adjacent channel interference.

First consider the case of an analog AM signal of interest. The receiver will weight the demodulated LSB and USB signals before summing them to form the audio output. The maximum audio SNR is achieved by weighting the LSB and USB in proportion to their individual SNRs. The weights are further normalized such that the sum of the weights is one. Assuming the signal power is the same for each sideband, then the individual weights are inversely proportional to the estimated noise power in each sideband. Let:

$\sigma_{n\_usb}^2$, be the variance of the noise and interference in the USB $\sigma_{n\_usb}^2$, be the variance of the noise and interference in the LSB If a weight of b is applied to the LSB, then a weight of 1−b must be applied to the USB to maintain a constant signal gain over the range. Then the sideband combining takes the form:

$$\hat{m}(t)=b(t)\cdot\hat{m}_{usb}(t)+(1-b(t))\cdot\hat{m}_{lsb}(t)$$

The optimum value of b(t) can be found as a function of the variance of the interference plus noise on each sideband. It is assumed that the DSB signal m(t) has equal power on each sideband. The signal power of the combined sideband components and the noise and interference power is found through the expectation E and temporary removal of the dependence on time. For convenience of notation:

$$E\{\hat{m}^2\} = E\{(b \cdot [m + n_{usb}] + (1-b) \cdot [m + n_{lsb}])^2\}$$

$$= E\{m^2 + b^2 \cdot [n_{usb}^2 + n_{lsb}^2] - 2 \cdot b \cdot n_{lsb}^2 + n_{lsb}^2\}$$

$$= S + b^2 \cdot [\sigma_{n\_usb}^2 + \sigma_{n\_lsb}^2] - 2 \cdot b \cdot \sigma_{n\_lsb}^2 + \sigma_{n\_lsb}^2$$

The power of signal m is S, which is constant. To find the value of b which minimizes the noise contributions, the derivative is set to zero, and the equations are solved for b.

$$\frac{d}{db}\{S + b^2 \cdot [\sigma_{n\_usb}^2 + \sigma_{n\_lsb}^2] - 2 \cdot b \cdot \sigma_{n\_lsb}^2 + \sigma_{n\_lsb}^2\} \equiv 0$$

then $2 \cdot b \cdot [\sigma_{n\_usb}^2 + \sigma_{n\_lsb}^2] - 2 \cdot \sigma_{n\_lsb}^2 = 0$ $$b = \frac{\sigma_{n\_lsb}^2}{\sigma_{n\_usb}^2 + \sigma_{n\_lsb}^2}$$

Therefore the audio output with the maximum SNR under the filter constraints is then approximated by:

$$\hat{m}(t) = b \cdot \hat{m}_{usb}(t) + (1-b) \cdot \hat{m}_{lsb}(t)$$

$$= \text{Re}\{r(t)\} + (1 - 2 \cdot b) \cdot \text{Im}\{r(t)\}_h$$

The weighting factor b depends upon estimating the variance of the noise and/or interference in each sideband (interference will include noise for this discussion). It would be virtually impossible to estimate the interference in each sideband independently since the interference is indistinguishable from the signal. However, exploitation of some properties of the DSB modulation enables a method of estimation. The ideal DSB audio signal m(t) has only an in-phase signal component and zero quadrature component. Any interference not correlated with m(t) would have equal-variance components in both the inphase and quadrature dimensions. Hence half of the interference can be observed in the quadrature component of the received signal, while the other half is concealed within the in-phase component along with m(t).

The quadrature component of the noise alone is not sufficient to determine the level of interference on each sideband. However this quadrature component can be cross-correlated with each sideband to statistically determine the relative amount of contamination of each sideband. These cross-correlations can be estimated through multiplication in the time domain of the Hilbert Transform of the quadrature component with each sideband, then lowpass filtering the results over a sufficiently long time to estimate the LSB and USB cross-correlation with the quadrature interference. An infinite impulse response (IIR) lowpass filter with a time constant τ on the order of roughly a second could be used. The Hilbert Transform of the quadrature component, designated $\text{Im}\{r(t)\}_h = \text{Im}\{n(t)\}_h$, is of interest because the SSB demodulation process transforms its interference accordingly. The component $\text{Im}\{n(t)\}_h$ is already computed in the USB or LSB demodulation process. The cross-correlations for the USB and LSB can be, represented as:

$$\hat{\sigma}_{n\_usb}^2(t-\tau) = \{-\hat{m}_{usb}(t) \cdot \text{Im}\{r(t)\}_h\}_{lpf}$$

$$\hat{\sigma}_{n\_lsb}^2(t-\tau) = \{\hat{m}_{lsb}(t) \cdot \text{Im}\{r(t)\}_h\}_{lpf}$$

The results of these correlations can be analyzed using statistical expectation instead of dependence upon time filtering:

$$\sigma_{n\_usb}^2 = E\{-(\hat{m} + \text{Re}\{n\} - \text{Im}\{n\}_h) \cdot \text{Im}\{n\}_h\}$$

$$= E\{(\text{Im}\{n\}_h - \text{Re}\{n\}) \cdot \text{Im}\{n\}_h\}$$

$$= \frac{\sigma_n^2}{2} - E\{\text{Re}\{n\} \cdot \text{Im}\{n\}_h\}$$

and similarly, $$\sigma_{n\_lsb}^2 = \frac{\sigma_n^2}{2} + E\{\text{Re}\{n\} \cdot \text{Im}\{n\}_h\}$$

If the interference is strictly on one sideband with zero interference on the other, then the expectation $E\{\text{Re}\{n\} \cdot \text{Im}\{n\}_h\}$ is equal to $$\pm \frac{\sigma_n^2}{2}$$

with sign depending on whether the noise is on the LSB or USB, respectively. If the noise is equally distributed on both sidebands, but uncorrelated, then $E\{\text{Re}\{n\} \cdot \text{Im}\{n\}_h\} = 0$. These results are due to the properties of the Hilbert Transform. These cross-correlation results are statistically proportional to the variance, or power, of the interference in each sideband. Therefore, the cross-correlations can be used in the determination of the weighting factor b(t).

$$b(t) \equiv \frac{\hat{\sigma}_{n\_lsb}^2(t-\tau)}{\hat{\sigma}_{n\_lsb}^2(t-\tau) + \hat{\sigma}_{n\_lsb}^2(t-\tau)}$$

A time delay can be inserted in the signal path before weighting to compensate for the delay of the filter used to compute b(t). The receiver uses time averaging to estimate the USB and LSB noise terms to compute b(t).

The invention is also applicable to demodulation of hybrid IBOC DAB signals. The difference between the hybrid IBOC DAB and analog demodulation is the addition of the quadrature complementary subcarriers d(t) under the analog signal. These subcarriers have no real component and must be treated differently than noise or interference. The USB and LSB signals for the hybrid DAB scenario are:

$$\hat{m}_{usb}(t) = \text{Re}\{r(t) + i \cdot r_h(t)\} = m(t) + \text{Re}\{n(t)\} - \text{Im}\{n(t)\}_h - d_h(t)$$

$$\hat{m}_{lsb}(t) = \text{Re}\{r(t) - i \cdot r_h(t)\} = m(t) + \text{Re}\{n(t)\} + \text{Im}\{n(t)\}_h + d_h(t)$$

Combining the USB and LSB weighted by b and 1−b, respectively, yields:

$$\hat{m}(t) = b(t) \cdot \hat{m}_{usb}(t) + (1 - b(t)) \cdot \hat{m}_{lsb}(t)$$

$$= m(t) + \text{Re}\{n(t)\} + (1 - 2 \cdot b) \cdot \text{Im}\{n(t)\}_h + (1 - 2 \cdot b) \cdot d_h(t)$$

$$= \text{Re}\{r(t)\} + (1 - 2 \cdot b) \cdot \text{Im}\{r(t)\}_h$$

For simplicity we define the new term c(t) as:

$$c(t) = 2 \cdot b(t) - 1, \text{ then}$$

$$\hat{m}(t) = Re\{r(t)\} - c(t) \cdot Im\{r(t)\}_h$$

This form of the expression shows that the demodulated output starts with the coherent DSB demodulated signal Re{r(t)}, then subtracts an interference component created by the sideband imbalance Im{r(t)}$_h$, weighted by c(t). Some properties of c(t) are described next. Separate the noise into LSB and USB components. Seperate the noise into LSB and USB components.

$$n(t) = n_{lsb}(t) + n_{usb}(t)$$

Then $$\hat{m}(t) = Re\{r(t)\} - c(t) \cdot Im\{r(t)\}_h; \text{ or equivalently,}$$

$$\hat{m}(t) = m(t) + Re\{n_{lsb}(t) + n_{usb}(t)\} + Im\{n_{lsb}(t) + n_{usb}(t)\}_h$$

Let x(t) and y(t) represent the real parts of the $n_{lsb}(t)$ and $n_{usb}(t)$, respectively. Then the single sideband noise components are expressed as functions of the Hilbert Transforms:

$$n_{lsb}(t) = x(t) - i \cdot x(t)_h; \text{ and } n_{usb}(t) = y(t) - i \cdot y(t)_h$$

The expression for $\hat{m}(t)$ is equivalent to:

$$\hat{m}(t) = m(t) + x(t) + y(t) - [y(t) - x(t)] \cdot \frac{E\{y^2 - x^2\}}{E\{y^2 - 2 \cdot x \cdot y + x^2\}}$$

$$= m(t) + x(t) + y(t) - [y(t) - x(t)] \cdot \frac{\sigma_y^2 - \sigma_y^2}{\sigma_y^2 + \sigma_y^2}$$

where $$c(t) = \frac{\sigma_y^2 - \sigma_y^2}{\sigma_y^2 - \sigma_y^2}$$

It has been shown that c(t) yields the minimum noise. Furthermore it is clear that $-1 \leq c(t) \leq 1$, c(t)=1 when the noise is entirely in the USB, c(t)=-1 when the noise is entirely in the LSB, and c(t)=0 when the noise in the LSB equals the noise in the USB.

Taking expectations to find the power of the combined signal, and temporarily dropping the dependence upon time yields:

$$E\{\hat{m}^2\} = E\{[m + Re\{n\} - c \cdot Im\{n\}_h - c \cdot d_h]^2\}$$

Removing the signal power of m(t) leaves only the noise-like terms which are to be minimized.

$$E\{\hat{m}^2\} - E\{m^2\} = E\{(Re\{n\})^2\} + c^2 \cdot [E\{(Im\{n\}_h)^2\} + E\{d_h^2\}] - 2 \cdot c \cdot E\{Re\{n\} \cdot Im\{n\}_h\}$$

$$= \frac{\sigma_n^2}{2} + c^2 \cdot \left(\frac{\sigma_n^2}{2} + \sigma_d^2\right) - 2 \cdot c \cdot E\{Re\{n\} \cdot Im\{n\}_h\}$$

The value of c yielding the minimum noise contribution is found by setting the derivative of the noise expression to zero, then solving for c.

$$\frac{d}{dc}\left\{E\{(Re\{n\})^2\} + c^2 \cdot [E\{(Im\{n\}_h)^2\} + E\{d_h^2\}] - 2 \cdot c \cdot E\{Re\{n\} \cdot Im\{n\}_h\}\right\} \equiv 0$$

$$\frac{d}{dc}\left\{c^2[E\{(Im\{n\}_h)^2\} + E\{d_n^2\}] - c \cdot 2 \cdot E\{Re\{n\} \cdot Im\{n\}_h - c\right\} \equiv 0$$

$$- c \cdot 2 \cdot [E\{(Im\{n\}_h)^2\} + E\{d_h^2\}] + 2 \cdot E\{Re\{n\} \cdot Im\{n\}_h\} \equiv 0$$

$$c = \frac{E\{Re\{n\} \cdot Im\{n\}_h\}}{E\{(Im\{n\}_h)^2\} + E\{d_h^2\}}; \text{ where } -1 \leq c \leq 1$$

Notice that when $E\{Re\{n\} \cdot Im\{n\}_h\} = 0$, which implies that the USB and LSB noise is uncorrelated with same variance, then the result is equivalent to DSB demodulation. Since the analog signal, the interference, and the quadrature digital subcarriers are assumed uncorrelated, the expectation in the numerator of the last expression can be replaced by:

$$E\{Re\{n\} \cdot Im\{n\}_h\} = E\{Re\{r\} \cdot Im\{r\}_h\}$$

while the expectations in the denominator can be replaced with:

$$E\{(Im\{n\}_h)^2\} + E\{d_h^2\} = E\{(Im\{r\}_h)^2\}$$

Therefore the method to compute c becomes:

$$c = \frac{E\{Re\{r\} \cdot Im\{r\}_h\}}{E\{Im\{r\}^2\}}$$

Since the interference changes over time, lowpass filtering is used to replace the expectations in a practical implementation.

$$c(t) = \frac{\{Re\{r(t)\} \cdot Im\{r(t)\}_h\}_{lpf}}{E\{Im\{r(t)\}^2\}_{lpf}}$$

For practical implementation, it may also be desirable to force c(t)=0 when the interference is small, since the short-term estimates of the cross-correlation are contaminated by m(t). Furthermore, it may also be desirable to force c(t)=±1 when the interference dominates on one sideband. The practical expression for c(t) can be modified as:

$$c'(t) = \frac{2 \cdot \{Re\{r(t)\} \cdot Im\{r(t)\}_h\}_{lpf}}{E\{Im\{r(t)\}^2\}_{lpf} + P}; \text{ limited to } -1 \leq c'(t) \leq 1$$

where P≅0.004 for Hybrid, or P≅0.00004 for Analog (carrier=1)

Figure 4:
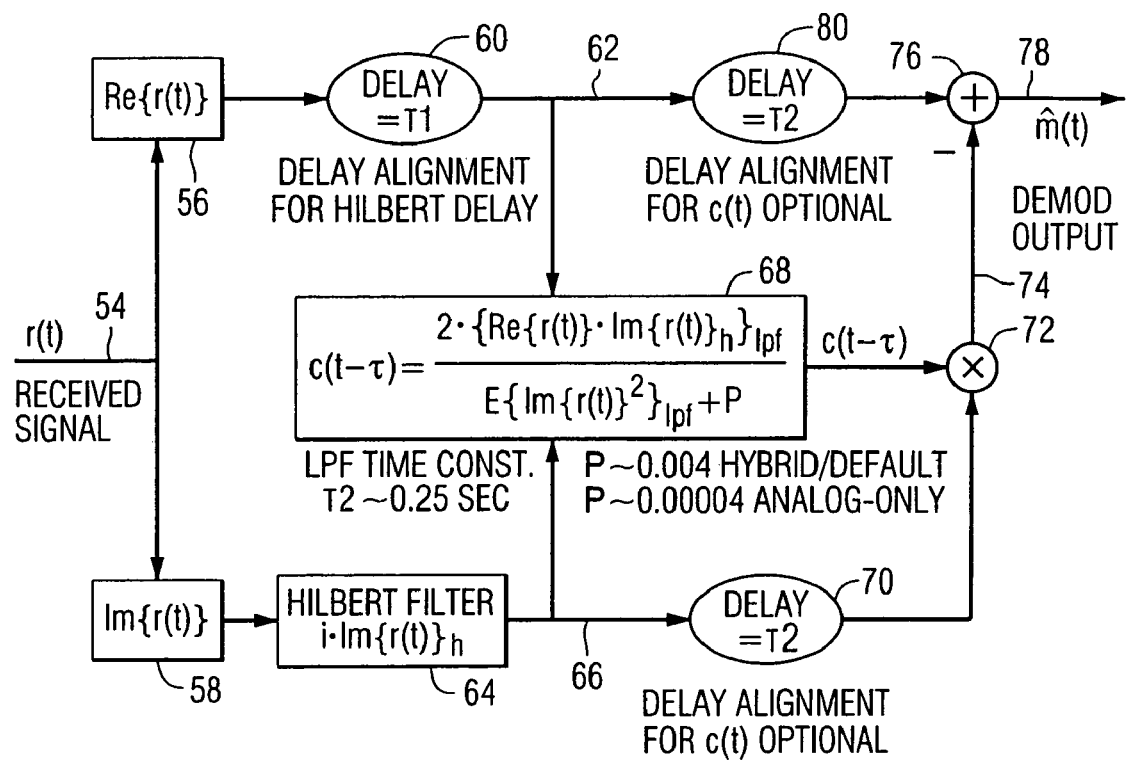
FIG. 4 is a functional block diagram of an AM demodulator that is constructed in accordance with the invention.

A functional block diagram of the feed forward correction for an AM adaptive weighted sideband demodulator is shown in FIG. 4. In FIG. 4, a signal is received on line 54 and split into real and imaginary components as illustrated by blocks 56 and 58. The real signal component can be delayed as shown by block 60 to produce a delayed signal on line 62. A Hilbert Transform can be taken of the imaginary signal as shown by block 64 to produce a transformed signal on line 66. The signals on lines 62 and 66 are used to calculated the C(t−τ) factor as shown by block 68. The transformed signal on line 66 can be further subjected to an optional delay as shown by block 70 and mixed with the C(t–τ) factor in mixer 72 and the resulting signal on line 74 is combined with the real component at summation point 76 to produce an output signal on line 78. The real component can be subjected to an optional further delay 80 prior to being combined with the signal on line 74.

It is assumed that the received signal r(t) is phase-synchronized with the AM carrier such that the real and imaginary components of r(t) can be separated at baseband. The delay τ1 is inserted because the Hilbert Transform filter incurs a delay to make it causal. The optional τ2 delay better aligns the signal with the delay of the LPF used to compute the correction weight c(t). The term P used in the computation for c(t) forces the weight toward zero for DSB demodulation when the noise is small. If it is not known whether the received signal is hybrid or analog, it is preferable to use the larger value of P.

The resulting total noise and interference power in the demodulated output signal is of interest since the signal can be further processed to reduce the effects of the noise. Specifically the post-detection bandwidth can be reduced as the noise becomes higher. The expression derived for the total output noise is:

$$\hat{\sigma}^2_{N+1} = E\{\hat{m}^2\} - E\{m^2\}$$
$$= E\{(\text{Re}\{n\})^2\} + c^2 \cdot [E\{(\text{Im}\{n\}_h)^2\} + E\{d_n^2\}] -$$
$$2 \cdot c \cdot E\{\text{Re}\{n\} \cdot \text{Im}\{n\}_h\}$$

This noise can be estimated accurately for the analog-only signal. Assuming $E\{d_h^2\}=0$, and $E\{(\text{Re}\{n\})^2\}=E\{(\text{Im}\{n\})^2\}$, the terms can be evaluated as:

$$\hat{\sigma}^2_{N+1,analog} = (1+c^2) \cdot E\{(\text{Im}\{r\}_h)^2\} - 2 \cdot c \cdot E\{\text{Re}\{r\} \cdot \text{Im}\{r\}_h\}$$

Unfortunately, the noise for the analog portion of the hybrid signal can only be approximated since $E\{d_h^2\} \neq 0$, and a practical way has not been devised to estimate $E\{(\text{Im}\{n\}_h)^2\}$ alone. As a first approximation, the noise expression above can be used to upper bound the noise in the hybrid case. This noise is overestimated in the hybrid case since the quadrature digital subcarrier noise does not exist in the real component of the signal. When the value of c approaches ±1, this error diminishes and the interference dominates. However, when c is close to zero, the quadrature digital subcarrier noise is cancelled in the demodulated output m̂(t), and the noise expression does not account for this cancellation. Fortunately, this effect may be inconsequential if the bandwidth limiting is invoked only when the estimated interference dominates over the quadrature digital subcarrier noise.

Further improvement on the audio SNR can be achieved through frequency-selective combining of the USB and LSB sidebands. Since power spectral density (PSD) of the interference is generally not uniform over the audio bandwidth, the frequency-selective combining could maximize the SNR over multiple frequency subbands that comprise the audio bandwidth. One practical method to achieve this is to employ the properties of quadrature mirror filters (QMF). The property of QMFs is that the sum of these filters, having overlapping frequency subbands, combine to result in a flat response over the audio bandwidth.

The sideband combining method described here is simply applied over each subband of r(t) over a bank of QMFs comprising the maximum desired audio bandwidth. Specifically, $$r(t) = \sum_n [\text{Re}\{r(t)\} + \text{Im}\{r_{QMFn}(t)\}]$$

$$c_{QMFn}(t) = \frac{\{\text{Re}\{r_{QMFn}(t)\} \cdot \text{Im}\{r_{QMFn}(t)\}_h\}_{lpf}}{E\{\text{Im}\{r_{QMFn}(t)\}^2\}_{lpf}}$$

$$\hat{m}(t) = \text{Re}\{r(t)\} - \sum_n c_{QMFn}(t) \cdot \text{Im}\{r_{QMFn}(t)\}_h$$

where the subscript QMFn indicates that the signal is processed after applying the nth QMF filter. Hence n values of $c_{QMFn}(t)$ are computed, one for each subband, then the combining is applied for each subband. The noise in each combined subband can also be estimated (exact for an ideal analog-only signal of interest (SOI), or an upper bound for a hybrid signal of interest).

$$\hat{\sigma}^2_{QMFn,N+1} = (1+c_{QMFn}^2) \cdot E\{(\text{Im}\{r_{QMFn}\}_h)^2\} - 2 \cdot c_{QMFn} \cdot E\{\text{Re}\{r_{QMFn}\} \cdot \text{Im}\{r_{QMFn}\}_h\}$$

The noise can be reduced further through bandlimiting as a function of the estimated noise in each subband. For example the bandlimiting can be performed by suppressing the higher frequency QMF outputs in the combining process as a function of the noise. For example, $$\hat{m}(t) = \sum_n f(\sigma^2_{QMFn,N+1}) \cdot (\text{Re}\{r_{QMFn}(t)\} - c_{QMFn}(t) \cdot \text{Im}\{r_{QMF}(t)\}_h)$$

$$f(\sigma^2_{QMFn,N+1}) = \frac{1}{1 + g_{QMFn} \cdot \sigma^2_{QMFn,N+1}}$$

where $g_{QMFn}$ sets the "knee" of the noise suppression function for the nth subband.

Figure 5:
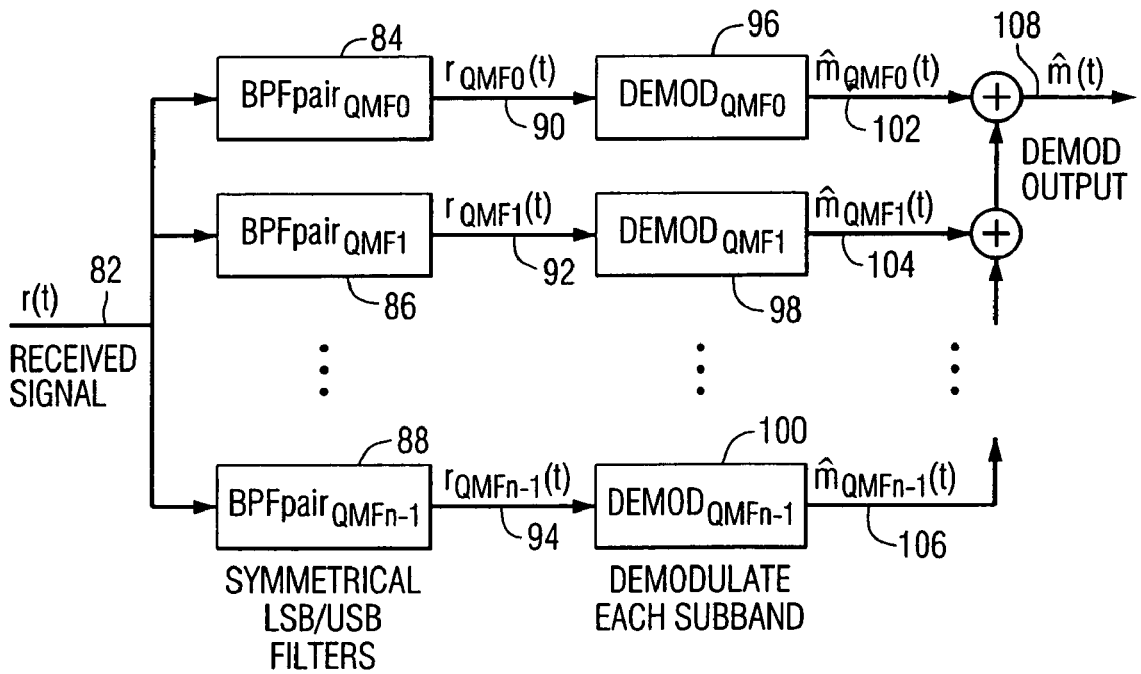
FIG. 5 is a functional block diagram of the frequency selective combining technique of the invention.

A functional diagram of the frequency subband combining technique is shown in FIG. 5. In FIG. 5, a signal r(t) is received on line 82 and passed through a plurality of bandpass filter pairs 84, 86, and 88 to produce a plurality of filtered signals on line 90, 92 and 94. The filtered signals are demodulated as illustrated by demodulators 96, 98 and 100 and the demodulated signals on lines 102, 104 and 106 are summed to produce an output signal on line 108.

Figure 6:
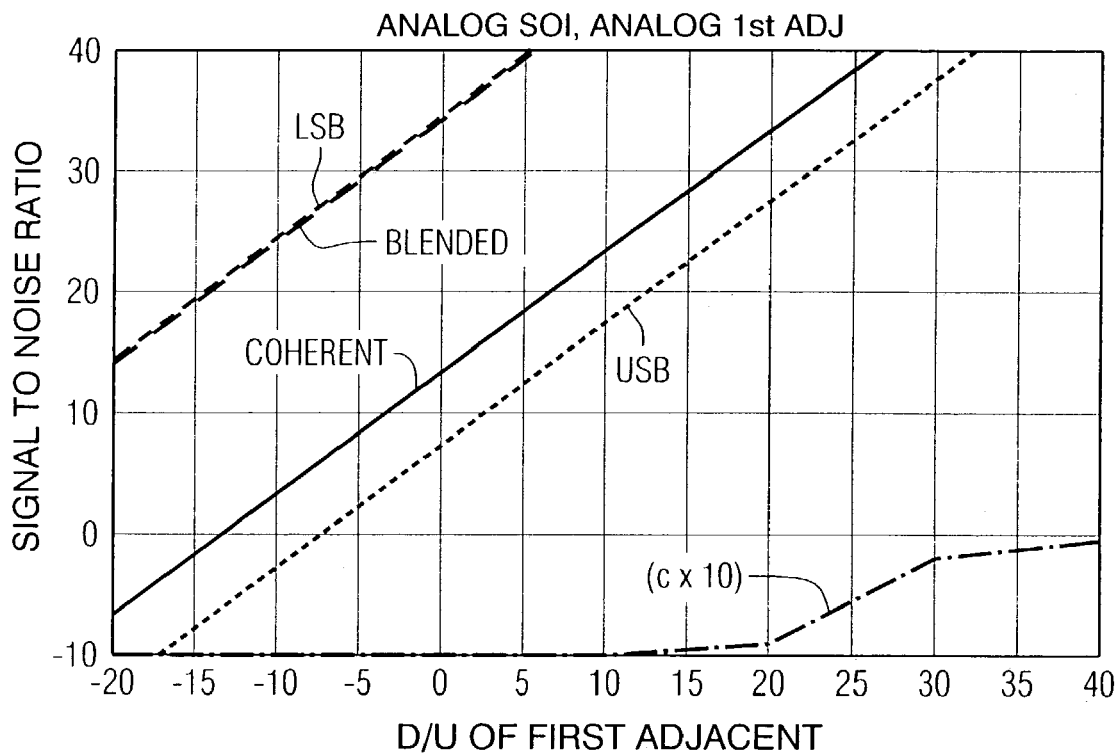
FIGS. 6–9 are graphs show the performance of the Coherent, SSB and DSB blended demodulators with first adjacent channel interference.
Figure 7:
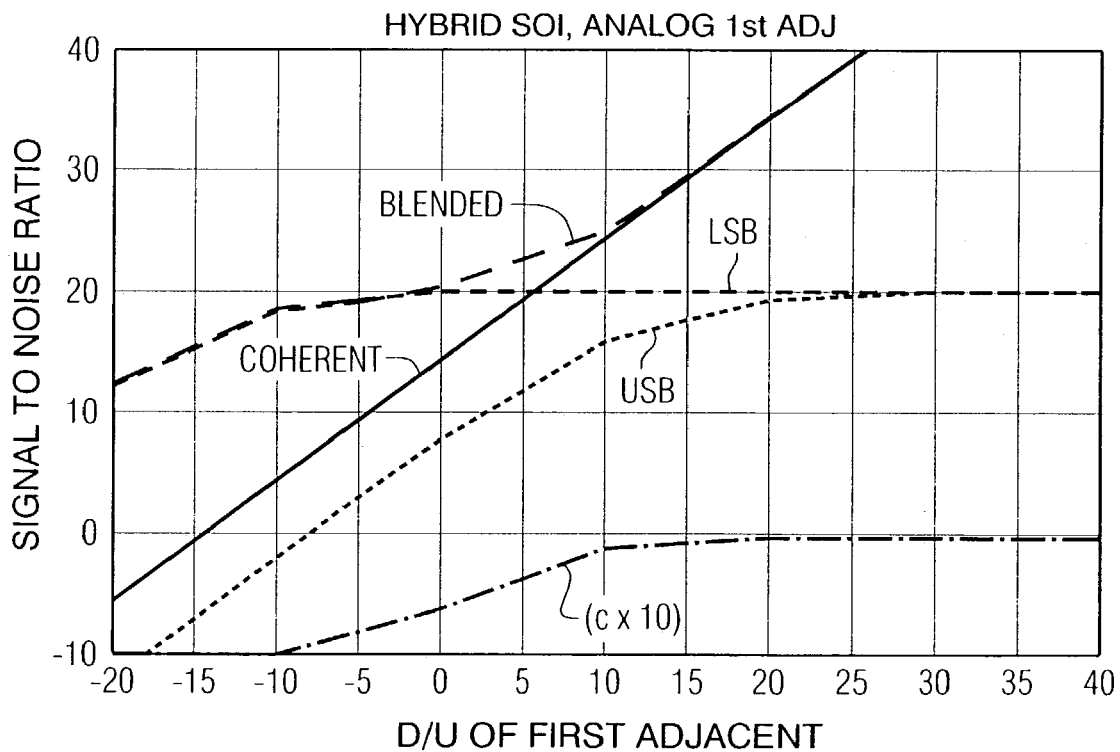
Figure 8:
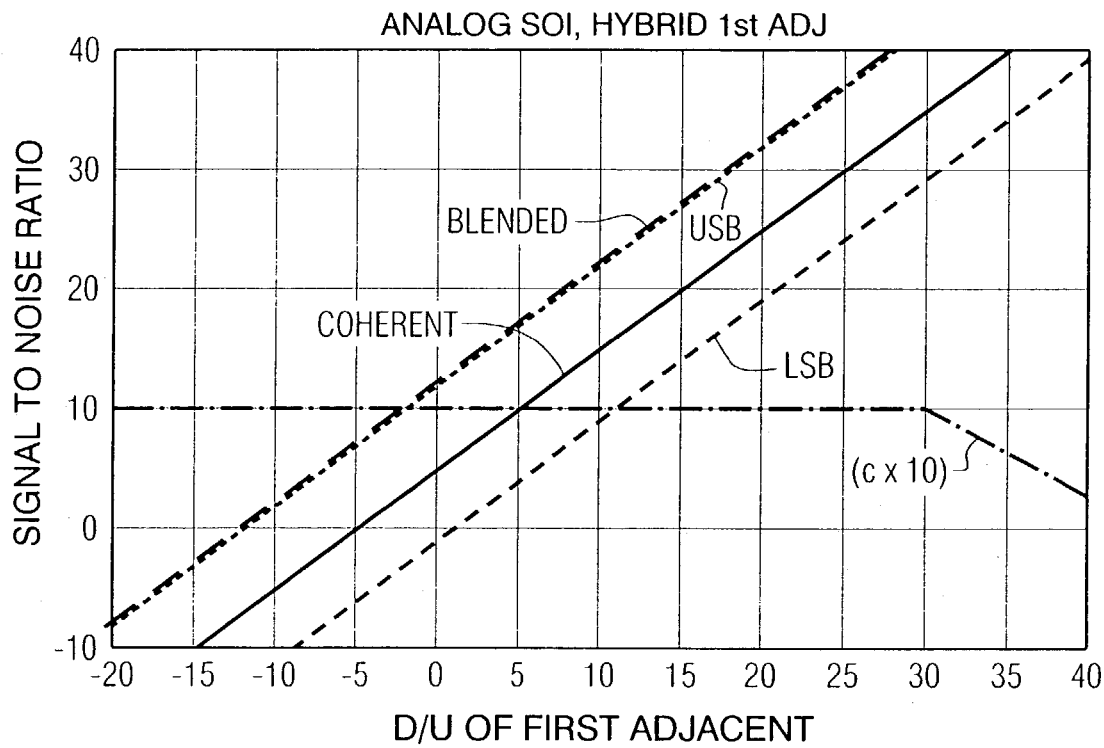
Figure 9:
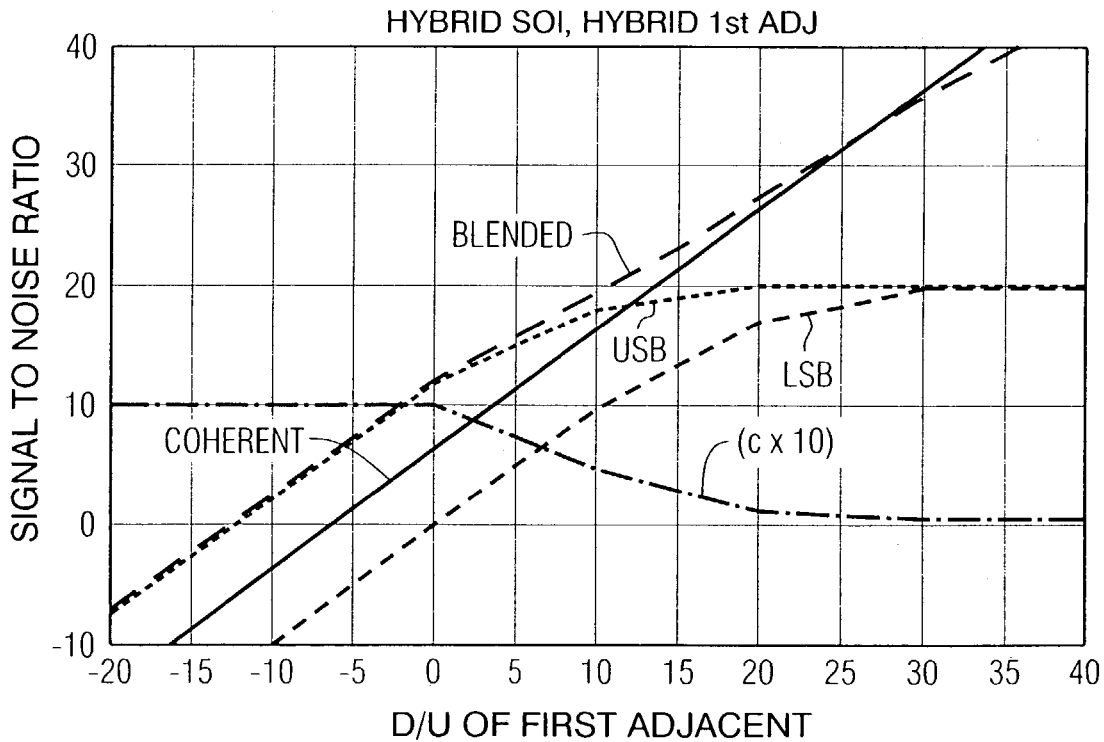

FIGS. 6–9 show the AM demodulator performance under various interference conditions. The vertical axes are the SNR in dB of the analog audio signal, while the horizontal axes are the ratio of the desired signal to the first-adjacent interferer in dB. The plots show the individual performance of a coherent DSB demodulator, a USB demodulator, a LSB demodulator, and the proposed weighted sideband demodulator (Blended). The value of the weighting factor c(t) is also shown as multiplied by a factor of 10. FIG. 6 plots the performance of an analog-only signal of interest (SOI) with an analog-only first adjacent interferer. FIG. 7 plots the performance of an IBOC Hybrid signal SOI with an analog-only first adjacent interferer. FIG. 8 plots the performance of an analog-only SOI with a hybrid first adjacent interferer. FIG. 9 plots the performance of an IBOC Hybrid SOI with a Hybrid IBOC first adjacent interferer. The plots clearly show that the proposed weighted sideband demodulator significantly outperforms the others over the range of interference levels.

Figure 10:
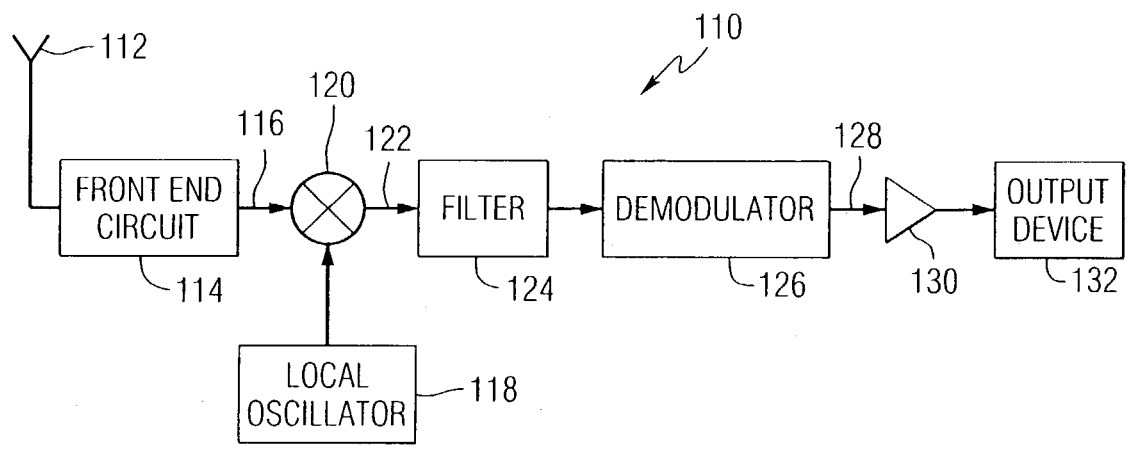
FIG. 10 is a functional block diagram of an AM receiver that is constructed in accordance with the invention.

FIG. 10 is a functional block diagram of an AM receiver 110 that is constructed in accordance with the invention. The AM radio signal is received on antenna 112. A front end circuit 114, constructed in accordance with well known technology filters the antenna signal and produces a signal on line 116 that is mixed with a signal from local oscillator 118 in mixer 120 to produce an intermediate frequency signal on line 122. The intermediate frequency signal is then filtered by filter 124 and passed to a demodulator 126 that processes the signal in accordance with the above description and produces an output signal on line 128. The output signal can then be amplified by amplifier 130 and passed to an output device 132, such as a speaker.

Figure 11:
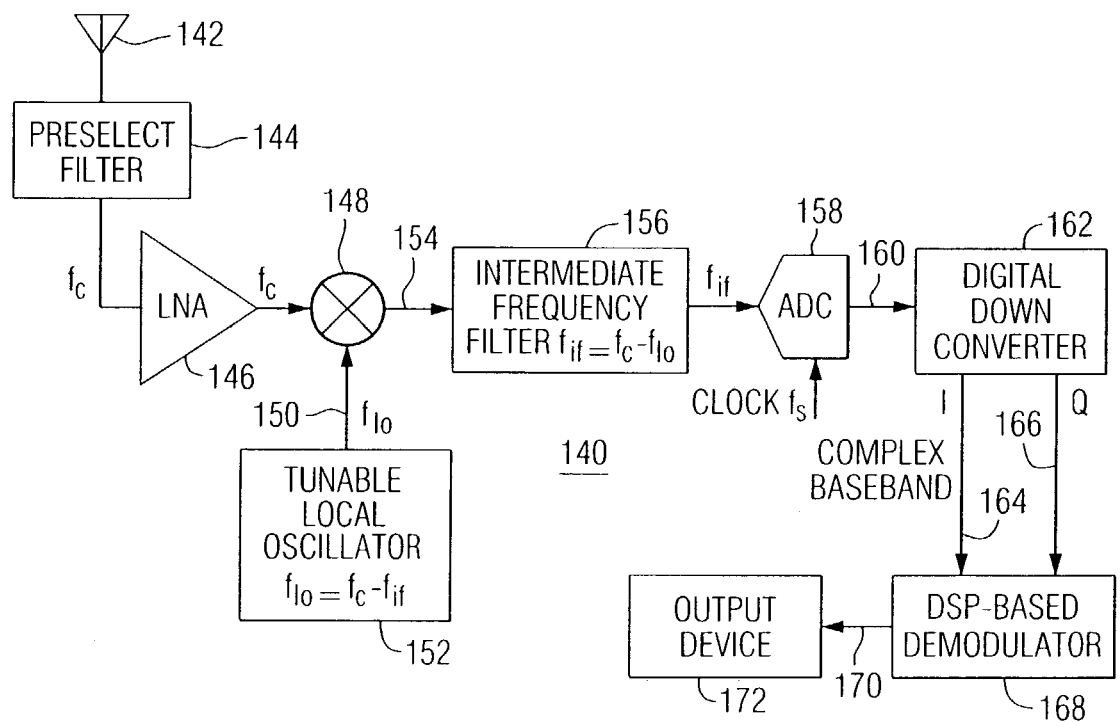
FIG. 11 is a functional block diagram of an AM receiver that is constructed in accordance with the invention.

FIG. 11 is a block diagram of a radio receiver 140 capable of performing the signal processing in accordance with this invention. The DAB signal is received on antenna 142. A bandpass preselect filter 144 passes the frequency band of interest, including the desired signal at frequency $f_c$, but rejects the image signal at $f_c-2f_{if}$ (for a low side lobe injection local oscillator). Low noise amplifier 146 amplifies the signal. The amplified signal is mixed in mixer 148 with a local oscillator signal $f_{lo}$ supplied on line 150 by a tunable local oscillator 152. This creates sum $(f_c+f_{lo})$ and difference $(f_c-f_{lo})$ signals on line 154. Intermediate frequency filter 156 passes the intermediate frequency signal $f_{if}$ and attenuates frequencies outside of the bandwidth of the modulated signal of interest. An analog-to-digital converter 158 operates using a clock signal $f_s$ to produce digital samples on line 160 at a rate $f_s$. Digital down converter 162 frequency shifts, filters and decimates the signal to produce lower sample rate in-phase and quadrature signals on lines 164 and 166. A digital signal processor based demodulator 168 then provides additional signal processing to produce an output signal on line 170 for output device 172.

Receivers constructed in accordance with this invention can automatically select between LSB, USB or DSB coherent demodulation as a function of the interference. The interference can be determined by estimating the variance of the noise and/or interference in each sideband. The maximum ratio combining (MRC) technique can approach DSB detection performance when the interference in the sidebands is equal.

While particular embodiments of this invention have been described above for purposes of illustration, it will be evident to those skilled in the art that numerous variations of the details of the present invention may be made without departing from the invention as defined in the appended claims.

What is claimed is:

1. A method of processing an AM radio signal comprising the steps of:
   receiving an AM radio signal including an upper sideband portion and a lower sideband portion;
   passing the upper sideband portion and the lower sideband portion through a plurality of bandpass filters to produce a plurality of filtered signals;
   demodulating the plurality of filtered signals to produce a demodulated upper sideband signal and a demodulated lower sideband signal;
   weighting the demodulated upper sideband signal and the demodulated lower sideband signal using a weighting factor that varies in response to signal to noise ratio in the demodulated upper sideband signal and the demodulated lower sideband signal to produce a weighted demodulated upper sideband signal and a weighted demodulated lower sideband signal; and
   combining the weighted demodulated upper sideband signal and the weighted demodulated lower sideband signal to produce an output signal.

2. The method of claim 1, further comprising the step of:
   determining a noise power of the demodulated upper sideband signal and the demodulated lower sideband signal prior to the step of weighting the demodulated upper sideband signal and the demodulated lower sideband signal.

3. The method of claim 2, wherein the step of determining the noise power of the demodulated upper sideband signal and the demodulated lower sideband signal comprises the steps of:
   cross-correlating a quadrature component of the demodulated upper sideband signal with the demodulated upper sideband signal; and
   cross-correlating a quadrature component of the demodulated lower sideband signal with the demodulated lower sideband signal.

4. The method of claim 3, wherein:
   the step of cross-correlating a quadrature component of the demodulated upper sideband signal with the demodulated upper sideband signal comprises the steps of shifting the quadrature component of the demodulated upper sideband signal by 90° and multiplying the shifted quadrature component of the demodulated upper sideband signal by the demodulated upper sideband signal; and
   the step of cross-correlating a quadrature component of the demodulated lower sideband signal with the demodulated lower sideband signal comprises the steps of shifting the quadrature component of the demodulated lower sideband signal by 90° and multiplying the shifted quadrature component of the demodulated lower sideband signal by the demodulated lower sideband signal.

5. The method of claim 1, wherein the weighting factor is a function of the variance of interference plus noise.

6. The method of claim 1, wherein the step of combining the weighted demodulated upper sideband signal and the weighted demodulated lower sideband signal further comprises the step of:
   frequency selective combining of the weighted demodulated upper sideband signal and the weighted demodulated lower sideband signal.

7. The method of claim 1, wherein the step of demodulating the plurality of filtered signals to produce a demodulated upper sideband signal and a demodulated lower sideband signal comprises the steps of:
   multiplying a Hilbert Transform of an imaginary component of the radio signal by a weighted correction signal to obtain a weighted signal; and
   subtracting the weighted signal from a coherent double sideband signal.

8. A method of processing an AM radio signal comprising the steps of:
   receiving an AM radio signal including an upper sideband portion and a lower sideband portion:
   demodulating the upper sideband portion and the lower sideband portion to produce a demodulated upper sideband signal and a demodulated lower sideband signal;
   weighting the demodulated upper sideband signal and the demodulated lower sideband signal using a weighting factor that varies in response to signal to noise ratio in the demodulated upper sideband signal and the demodulated lower sideband signal to produce a weighted demodulated upper sideband signal and a weighted demodulated lower sideband signal; and combining the weighted demodulated upper sideband signal and the weighted demodulated lower sideband signal to produce an output signal;

wherein the step of weighting the demodulated upper sideband signal and the demodulated lower sideband comprises the steps of multiplying the demodulated upper sideband signal by the weighting factor; and multiplying the demodulated lower sideband signal by one minus the weighting factor.

9. The method of claim 8, further comprising the step of:
single sideband filtering the AM radio signal prior to the step of demodulating the upper sideband portion and the lower sideband portion.

10. A demodulator for processing an AM radio signal comprising:
means for demodulating the upper sideband portion and the lower sideband portion of an AM radio signal to produce a demodulated upper sideband signal and a demodulated lower sideband signal;
means for weighting the demodulated upper sideband signal and the demodulated lower sideband signal using a weighting factor that varies in response to signal to noise ratio in the demodulated upper sideband signal and the demodulated lower sideband signal to produce a weighted demodulated upper sideband signal and a weighted demodulated lower sideband signal; and
means for combining the weighted demodulated upper sideband signal and the weighted demodulated lower sideband signal;
wherein the means for weighting the demodulated upper sideband signal and the demodulated lower sideband signal comprises means for multiplying the demodulated upper sideband signal by the weighting factor, and means for multiplying the demodulated lower sideband signal by one minus the weighting factor.

11. The demodulator of claim 10, further comprising:
means for determining a noise power of the demodulated upper sideband signal and the demodulated lower sideband signal prior to weighting the demodulated upper sideband signal and the demodulated lower sideband signal.

12. The demodulator of claim 11, wherein the means for determining the noise power of the demodulated upper sideband signal and the demodulated lower sideband signal comprises:
means for cross-correlating a quadrature component of the demodulated upper sideband signal with the demodulated upper sideband signal; and
means for cross-correlating a quadrature component of the demodulated lower sideband signal with the demodulated lower sideband signal.

13. The demodulator of claim 12, wherein:
the means for cross-correlating the quadrature component of the demodulated upper sideband signal with the demodulated upper sideband signal comprises means for shifting the quadrature component of the demodulated upper sideband signal by 90° and for multiplying the shifted quadrature component of the demodulated upper sideband signal by the demodulated upper sideband signal; and
the means for cross-correlating the quadrature component of the demodulated lower sideband signal with the demodulated lower sideband signal comprises means for shifting the quadrature component of the demodulated lower sideband signal by 90° and multiplying the shifted quadrature component of the demodulated lower sideband signal by the demodulated lower sideband signal.

14. The demodulator of claim 10, further comprising:
means for filtering the upper sideband portion and the lower sideband portion.

15. The demodulator of claim 10, wherein the means for demodulating the upper sideband portion and the lower sideband portion of an AM radio signal to produce a demodulated upper sideband signal and a demodulated lower sideband signal comprises:
means for multiplying a Hilbert Transform of an imaginary component of the radio signal by a weighted correction signal to obtain a weighted signal; and
means for subtracting the weighted signal from a coherent double sideband signal.

16. A receiver for processing an AM radio signal comprising:
means for receiving an AM radio signal including an upper sideband portion and a lower sideband portion;
means for demodulating the upper sideband portion and the lower sideband portion to produce a demodulated upper sideband signal and a demodulated lower sideband signal;
means for weighting the demodulated upper sideband signal and the demodulated lower sideband signal using a weighting factor that varies in response to signal to noise ratio in the demodulated upper sideband signal and the demodulated lower sideband signal to produce a weighted demodulated upper sideband signal and a weighted demodulated lower sideband signal; and
means for combining the weighted demodulated upper sideband signal and the weighted demodulated lower sideband signal to produce an output signal;
wherein the means for weighting the demodulated upper sideband signal and the demodulated lower sideband sianal comprises means for multiplying the demodulated upper sideband signal by the weighting factor, and means for multiplying the demodulated lower sideband signal by one minus the weighting factor.

17. The receiver of claim 16, further comprising:
means for single sideband filtering the AM radio signal prior to demodulating the upper sideband portion and the lower sideband portion.

18. The receiver of claim 16, further comprising:
means for determining a noise power of the demodulated upper sideband signal and the demodulated lower sideband signal prior to weighting the demodulated upper sideband signal and the demodulated lower sideband signal.

19. The receiver of claim 18, wherein the means for determining the noise power of the demodulated upper sideband signal and the demodulated lower sideband signal comprises:
means for cross-correlating a quadrature component of the demodulated upper sideband signal with the demodulated upper sideband signal; and
means for cross-correlating a quadrature component of the demodulated lower sideband signal with the demodulated lower sideband signal.

20. The receiver of claim 19, wherein:
the means for cross-correlating the quadrature component of the demodulated upper sideband signal with the demodulated upper sideband signal comprises means for shifting the quadrature component of the demodulated upper sideband signal by 90° and for multiplying the shifted quadrature component of the demodulated upper sideband signal by the demodulated upper sideband signal; and the means for cross-correlating the quadrature component of the demodulated lower sideband signal with the demodulated lower sideband signal comprises means for shifting the quadrature component of the demodulated lower sideband signal by 90° and for multiplying the shifted quadrature component of the demodulated lower sideband signal by the demodulated lower sideband signal.

21. The receiver of claim 16, further comprising:
means for filtering the upper sideband portion and a lower sideband portion.

22. The receiver of claim 16 wherein the means for demodulating the upper sideband portion and the lower sideband portion to produce a demodulated upper sideband signal and a demodulated lower sideband signal comprises:
means for multiplying a Hilbert Transform of an imaginary component of the radio signal by a weighted correction signal to obtain a weighted signal, and means for subtracting the weighted signal from a coherent double sideband signal.

23. A demodulator for processing an AM radio signal comprising:
a circuit for demodulating the upper sideband portion and the lower sideband portion of an AM radio signal to produce a demodulated upper sideband signal and a demodulated lower sideband signal;
a circuit for weighting the demodulated upper sideband signal and the demodulated lower sideband signal using a weighting factor that varies in response to signal to noise ratio in the demodulated upper sideband signal and the demodulated lower sideband signal to produce a weighted demodulated upper sideband signal and a weighted demodulated lower sideband signal; and
a combiner for combining the weighted demodulated upper sideband signal and the weighted demodulated lower sideband signal; p1 wherein the circuit for weighting the demodulated upper sideband signal and the demodulated lower sideband signal multiplies the demodulated upper sideband signal by the weighting factor, and multiplies the demodulated lower sideband signal by one minus the weighting factor.

24. The demodulator of claim 23, further comprising:
a circuit for cross-correlating a quadrature component of the demodulated upper sideband signal with the demodulated upper sideband signal; and
a circuit for cross-correlating a quadrature component of the demodulated lower sideband signal with the demodulated lower sideband signal.

25. The demodulator of claim 24, wherein:
the circuit for cross-correlating the quadrature component of the demodulated upper sideband signal with the demodulated upper sideband signal comprises a first phase shifter for shifting the quadrature component of the demodulated upper sideband signal by 90° and for multiplying the shifted quadrature component of the demodulated upper sideband signal by the demodulated upper sideband signal; and
the circuit for cross-correlating the quadrature component of the demodulated lower sideband signal with the demodulated lower sideband signal comprises a second phase shifter for shifting the quadrature component of the demodulated lower sideband signal by 90° and for multiplying the shifted quadrature component of the demodulated lower sideband signal by the demodulated lower sideband signal.

26. A receiver for processing an AM radio signal comprising:
an input for receiving an AM radio signal including an upper sideband portion and a lower sideband portion;
a demodulator for demodulating the upper sideband portion and the lower sideband portion to produce a demodulated upper sideband signal and a demodulated lower sideband signal;
a circuit for weighting the demodulated upper sideband signal and the demodulated lower sideband signal using a weighting factor that varies in response to signal to noise ratio in the demodulated upper sideband signal and the demodulated lower sideband signal to produce a weighted demodulated upper sideband signal and a weighted demodulated lower sideband signal; and
a combiner for combining the weighted demodulated upper sideband signal and the weighted demodulated lower sideband signal to produce an output signal;
wherein the circuit for weighting the demodulated upper sideband signal and the demodulated lower sideband signal multiplies the demodulated upper sideband signal by the weighting factor, and multiplies the demodulated lower sideband signal by one minus the weighting factor.

27. The receiver of claim 26, further comprising:
a circuit for cross-correlating a quadrature component of the demodulated upper sideband signal with the demodulated upper sideband signal; and
a circuit for cross-correlating a quadrature component of the demodulated lower sideband signal with the demodulated lower sideband signal.

28. The receiver of claim 27, wherein:
the circuit for cross-correlating the quadrature component of the demodulated upper sideband signal with the demodulated upper sideband signal comprises a first phase shifter for shifting the quadrature component of the demodulated upper sideband signal by 90° and for multiplying the shifted quadrature component of the demodulated upper sideband signal by the demodulated upper sideband signal; and
the circuit for cross-correlating the quadrature component of the demodulated lower sideband signal with the demodulated lower sideband signal comprises a second phase shifter for shifting the quadrature component of the demodulated lower sideband signal by 90° and for multiplying the shifted quadrature component of the demodulated lower sideband signal by the demodulated lower sideband signal.

29. A method of processing an AM radio signal comprising the steps of:
splitting the AM radio signal into real and imaginary components;
taking a Hilbert Transform of the imaginary component to produce a transformed signal;
using the real component and the transformed signal to calculate a weighting factor;
mixing the transformed signal with the weighting factor to produce a weighted transformed signal; and
combining the weighted transformed signal and the real component to produce an output signal.

30. The method of claim 29, further comprising the steps of:

delaying the transformed signal prior to mixing the transformed signal with the weighting factor; and delaying the real component prior to combining the weighted transformed signal and the real component.

31. The method of claim 29, wherein:

the real and imaginary components are separated at baseband.

32. The method of claim 29, wherein:

the weighting factor includes a term for forcing the weight to zero for double sideband modulation.

33. The method of claim 29, further comprising the step of:

frequency-selective combining upper sideband and lower sideband portions of the AM radio signal.

34. The method of claim 29, further comprising the step of:

reducing post-detection bandwidth of the signal as noise increases.

35. A receiver for processing an AM radio signal comprising:

a splitter for splitting the AM radio signal into real and imaginary components;

a processor for taking a Hilbert Transform of the imaginary component to produce a transformed signal and using the real component and the transformed signal to calculate a weighting factor;

a mixer for mixing the transformed signal with the weighting factor to produce a weighted transformed signal; and a combiner for combining the weighted transformed signal and the real component to produce an output signal.

36. The receiver of claim 35, further comprising:

a first delay circuit for delaying the transformed signal prior to mixing the transformed signal with the weighting factor; and a second delay circuit for delaying the real component prior to combining the weighted transformed signal and the real component.

37. The receiver of claim 35, wherein:

the real and imaginary components are separated at baseband.

38. The receiver of claim 35, wherein:

the weighting factor includes a term for forcing the weighting factor to zero for double sideband demodulation.

* * * * *